United States Patent [19]

Kasai

[11] Patent Number: 5,381,030
[45] Date of Patent: Jan. 10, 1995

[54] SEMICONDUCTOR MEMORY DEVICE WITH IMPROVED STEP PROTECTION AND MANUFACTURING METHOD THEREOF

[75] Inventor: Naoki Kasai, Tokyo, Japan
[73] Assignee: NEC Corporation, Tokyo, Japan
[21] Appl. No.: 233,560
[22] Filed: Apr. 26, 1994

Related U.S. Application Data

[63] Continuation of Ser. No. 886,941, May 22, 1992, abandoned.

[30] Foreign Application Priority Data

May 24, 1991 [JP] Japan ................................ 3-119681

[51] Int. Cl.⁶ ...................... H01L 23/48; H01L 29/40
[52] U.S. Cl. ................................. 257/390; 257/207; 257/208; 257/211
[58] Field of Search ............... 257/390, 207, 208, 211, 257/905, 911, 908

[56] References Cited

U.S. PATENT DOCUMENTS

| | | | |
|---|---|---|---|
| Re. 32,236 | 8/1986 | Scheuerlein | 257/390 |
| 4,212,026 | 7/1980 | Balasubramanian | 257/390 |
| 4,541,076 | 9/1985 | Bowers et al. | 257/390 |
| 4,827,449 | 5/1989 | Inoue | 365/63 |
| 5,031,018 | 7/1991 | Shirato et al. | 257/390 |
| 5,103,282 | 4/1992 | Isomara et al. | 257/211 |

FOREIGN PATENT DOCUMENTS

| | | | |
|---|---|---|---|
| 3447722 | 7/1985 | Germany . | |
| 3919625 | 12/1989 | Germany . | |
| 58-66343 | 4/1983 | Japan | 257/208 |
| 62-11262 | 1/1987 | Japan | 257/208 |
| 62-249478 | 10/1987 | Japan | 257/390 |
| 63-301544 | 12/1988 | Japan | 257/208 |

OTHER PUBLICATIONS

*IBM Tech Discl Bull*, 'Generalized Logic Image Masterslice Chip', vol. 32 No. 8B Jan. 1990, pp. 37-38.

*Primary Examiner*—Andrew J. James
*Assistant Examiner*—Stephen D. Meier
*Attorney, Agent, or Firm*—Sughrue, Mion, Zinn, Macpeak & Seas

[57] ABSTRACT

The semiconductor memory device according to the present invention includes a memory cell array region in which memory cells are arranged in array form, a first and a second row decoders arranged respectively on both sides of the memory cell array region, and a plurality of metallic wirings which are arranged within the memory cell array region in parallel to row direction, the respective one ends of the wirings are alternately connected to either of the first row decoder or the second row decoder, and the width of the metallic wirings that extend from the first or the second decoder to predetermined locations within the memory cell array region is greater than the width of the metallic wirings that extend beyond the predetermined locations within the memory cell array region.

With the above arrangement, the disconnection at the step part can be prevented, and the pattern formation in the step part becomes possible even if the focus is set at the height of the region with a fine pattern because of the increase in the focal depth of the resolution of the wiring pattern due to the widening of the wirings.

4 Claims, 4 Drawing Sheets

SEMICONDUCTOR MEMORY DEVICE WITH IMPROVED STEP PROTECTION AND MANUFACTURING METHOD THEREOF

This is a continuation of application No. 07/886,941 filed May 22, 1992, now abandoned.

BACKGROUND OF THE INVENTION

1. Field of the Invention

The present invention relates to a semiconductor memory device and a manufacturing method thereof, and more particularly, to a semiconductor memory device which has a small wiring resistance of a word line that constitutes a memory cell and is capable of being operated at high speed, and a manufacturing method thereof.

2. Description of the Prior Art

In a recent dynamic random access memory (DRAM), one memory cell is constituted of one insulated gate field effect transistor and one storage capacitor. The occupying area of the memory cell is being decreased as the memory capacity of the memory device is increased. For this reason, a method of forming a storage capacitor by stacking it in an upper layer, the so-called stacked capacitor memory cell, is being adopted in recent years as one of feasible methods for obtaining large storage capacitance for small area. With the employment of such a structure it becomes possible to increase the surface area of the capacitive electrode per unit area of the memory cell by augmenting the height of the capacitive electrode.

Moreover, in a DRAM, an improvement of the operating speed accompanying the increase in the memory capacity is also becoming necessary. As one of feasible methods for improving the operating speed, a structure which prevents the wiring delay, especially the wiring delay of word lines with large wiring length, is being employed in recent years. For example, in a paper by Sakao, et al. published before the International Electron Devices Meeting (IEDM), 1990, there is disclosed a method in which an aluminum alloy wiring with low resistance is arranged in an upper layer of a polysilicon wiring (word line) which becomes the gate electrode of the memory cell in order to reduce the wiring resistance of the polysilicon wiring, and connects the aluminum alloy wiring to the polysilicon wiring via a contact hole. According to this two-layer wiring structure it is possible to use polysilicon, which has excellent reliability though its resistance is high, as the gate electrode, and at the same time there can be obtained an effect of reducing the wiring resistance by the use of the metallic wiring.

In the above-mentioned stacked capacitor memory cell, a structure is adopted which increases the area of the side faces in addition to the area of the top surface of the capacitive storage electrode in order to obtain a large storage capacitance for a small area. Accordingly, a structure is obtained in which the height of the storage electrode part is large (1 μm, for example), and the large heights difference between the memory cell array forming region and other regions (for example, the region that connects the memory cell array region and a row decoder).

When a word line is to be given a two-layer structure in such a stacked memory, the part of the metallic wiring in the upper layer in the memory cell array forming region is formed at a high position since it is formed above the capacitive storage electrode, and the difference in height of that part with the metallic wiring in the upper layer formed in other regions becomes very large. As a result, there arises a problem that disconnection in the metallic wiring is generated in this stepped part, or a problem, in the photoresist process which requires a fine pattern resolution for forming a pattern of the metallic wirings, that a pattern resolution which simultaneously satisfies the memory cell array region and other regions becomes difficult to obtain because of the difference in focusing if the height difference becomes too large.

Accordingly, although it is possible to give the two-layer structure to the portion of the word line that is in the memory cell array forming region, in other part, for example, in the portion which connects the memory cell array forming region and the row decoder forming region, one is forced to form the word line in a single layer of polysilicon alone. This leads to a large value of the word line resistance which in turn results in the problem of reduction in the operating speed of the semiconductor memory device as a whole.

BRIEF SUMMARY OF THE INVENTION

Objects of the Invention

It is therefore the object of the invention to provide a semiconductor memory device which has small word line resistance and is callable of high speed operation even if the height of the memory cell array forming region is greater than that of other regions.

Summary of the Invention

The semiconductor memory device according to the invention includes a memory cell array region with memory cells arranged in array form, a plurality of word lines arranged in parallel to the row direction within the memory cell array region, first and second row decoders that are arranged on either side of the memory cell array region, and a plurality of metallic wirings arranged respectively over the plurality of word line on a via insulating layer, which are electrically connected to the word lines by means of contact parts, wherein the respective one ends of the metallic wirings are connected to either of the first row decoder or the second row decoder, and the width of the metallic wirings from the first or the second row decoder to specified locations within the memory cell array region is made greater than the width of the metallic wirings beyond the specified locations.

Each of the memory cells includes one insulated gate field effect transistor and one storage capacitor where a part of the word line is served as the gate electrode of the insulated gate field effect transistor and the storage capacitor is formed stacked above the insulated gate field effect transistor.

Further, the manufacturing method of the semiconductor memory device includes a process of disposing a plurality of wirings for word lines in parallel to the row direction within the memory cell array forming region, a process of forming contact holes reaching the wirings for word lines at predetermined locations of an insulating film previously deposited in the areas located above the wirings for word lines, a process of depositing a conductive film over the surface including the contact holes, a process of coating a resist film, a first run of exposure process which is carried out by the use of a first mask having a pattern of wirings with a width substantially the same as that of the wirings for word lines at areas located above the wirings for word lines, and a second run of exposure process, given following the first run of exposure process, which is carried out by the use of a second mask that has a pattern of wirings whose respective one ends extend alternately from the left-hand side or the right hand side of the memory cell array forming region towards the outside, and whose width for the portions from the respective one ends on the outside of the memory cell array region up to predetermined locations corresponding to areas above the wirings for word lines is greater than the wiring width of the wiring pattern of the first mask.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
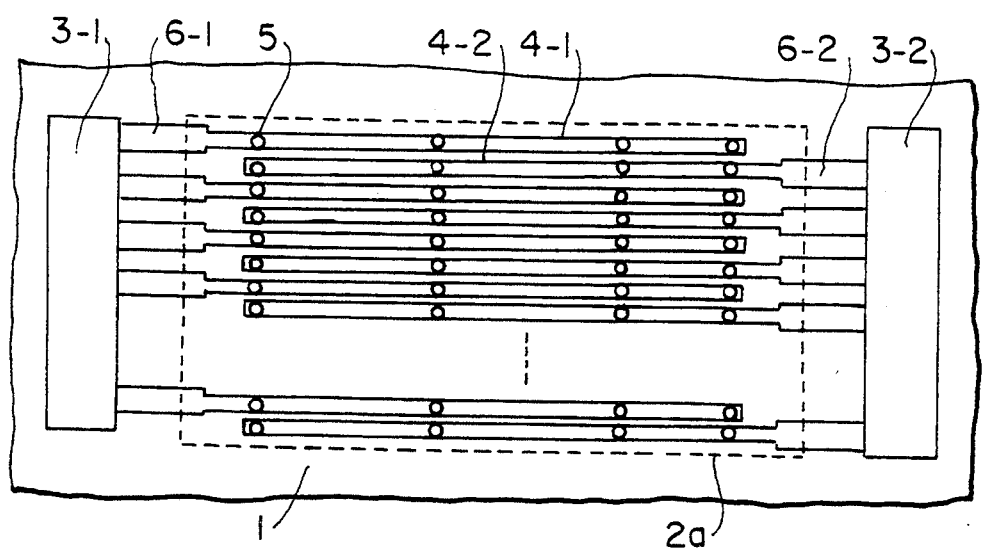
FIG. 1 is a plan view showing the arrangement of the metallic wirings for describing an embodiment of the invention.
Figure 2:
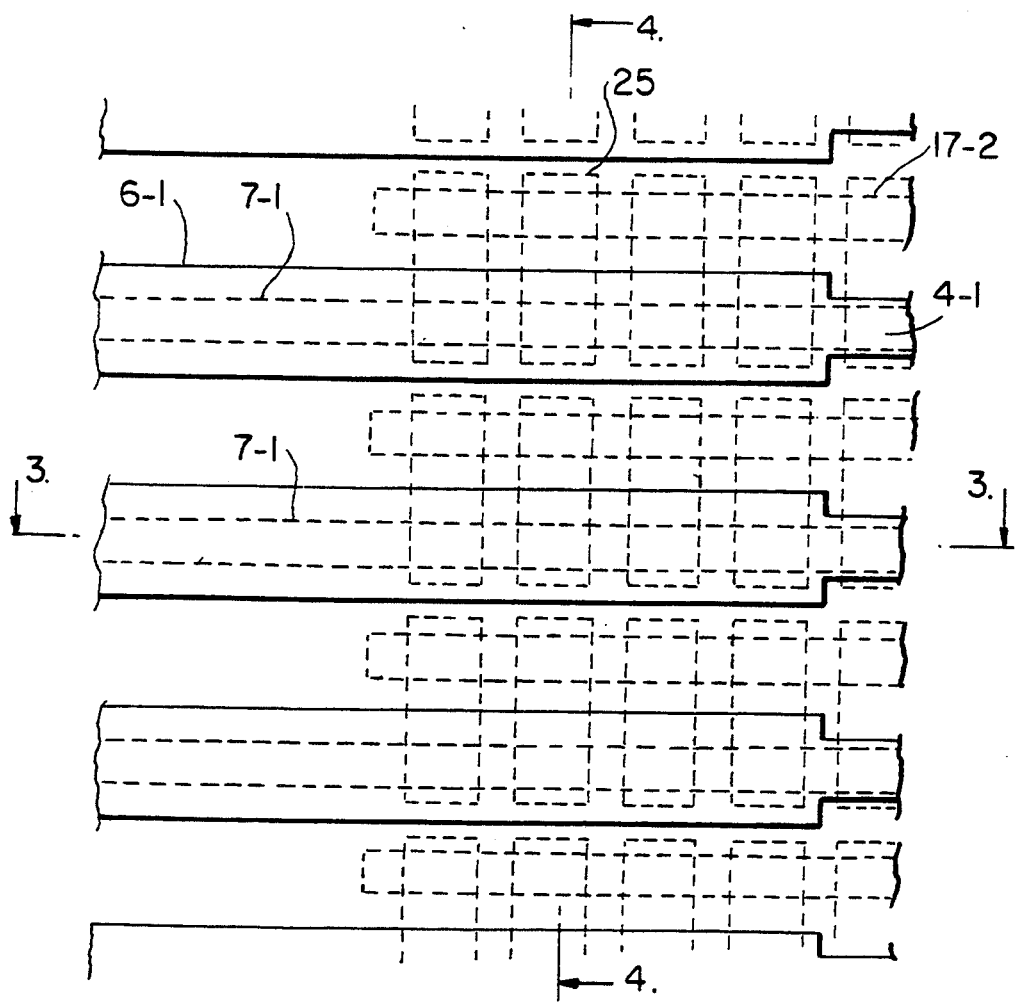
FIG. 2 is an enlarged partial view of FIG. 1.

Referring to FIG. 1 and FIG. 2 which is an enlarged partial view of FIG. 1, an embodiment of the invention will be described. On a P-type substrate 1 and on both sides of a memory cell array region 2 there are arranged a first row decoder 3-1 and a second row decoder 3-2. Word lines 7-1, 7-2 . . . , consisting of polysilicon and extending from the two row decoders to the interior of the memory cell array region 2a, and metallic wirings (made of an aluminum alloy) 4-1, 4-2, . . . which are arranged in an upper layer of the wirings and having a wiring width which is substantially the same as that of the word lines in the interior of the memory cell array region are respectively arranged. The word lines 7-1, 7-2, . . . , and the metallic wirings 4-1, 4-2, . . . , are connected electrically by contact parts 5 that are provided at an appropriate interval (100 μm, for example). The resistance of the word line is reduced owing to the electrical connection to the metallic wiring, which enables a high speed operation of the memory device.

The word line 7-1 with the metallic wiring 4-1 arranged in its upper layer, and the word line 7-2 with the metallic wiring 4-2 disposed above it, are alternately arranged within the memory cell array region 2a. Accordingly, the interval between the metallic wirings at the output part of the respective row decoders 3-1 and 3-2 is twice as large the wiring interval at the output part of the row decoders that are provided on one side alone of the memory cell array region, as is the case in the prior art. Therefore, the width of the metallic wirings 6-1, 6-2, . . . , for the portions from the respective row decoders 3-1 and 3-2 to midway points within the memory cell array region 2a (in this embodiment the regions immediately before the first contact parts 5, namely, the regions where the alternate arrangement of the metallic wirings ends) is formed greater than the width of the ordinary wirings (for example, twice as large the width of the word lines).

Next, referring to FIG. 3 and FIG. 4, the structure of the two-layered wiring consisting of the word line and the metallic wiring and of the memory cell described by reference to FIG. 1 and FIG. 2 will be presented in more detail.

One memory cell is constituted by including an insulated gate field effect transistor consisting of, for example, a word line 7-1 made of polysilicon served as a gate electrode, a gate insulating film 18, and a diffused region 17 that becomes a source and a drain regions, and a storage capacitor consisting of a capacitive electrode 25 which is connected to a diffused region 17 via a contact 20, a capacitive insulating film 26 and a plate electrode 27. The height of the capacitive electrode 25 is made large in order to increase the capacitance of the storage capacitor. Accordingly, the metallic wiring 6-1 that is provided in an upper layer of the storage capacitor has a greater height (about 1 μm) at the portion of the memory cell array region 2a than in other parts as shown in FIG. 3. It should be noted, although not shown explicity in FIG. 3 and FIG. 4, that the contact parts that electrically connect the metallic wirings 6-1, 6-2, . . . , to the metallic wirings 7-1, 7-2, . . . , are provided within the memory cell array region 2a at an interval of about 100 μm, and electrically connect the word lines 7-1, 7-2, . . . , and the metallic wirings 4-1, 4-2, . . . , (wirings with a width substantially the same as the word lines).

Figure 3:
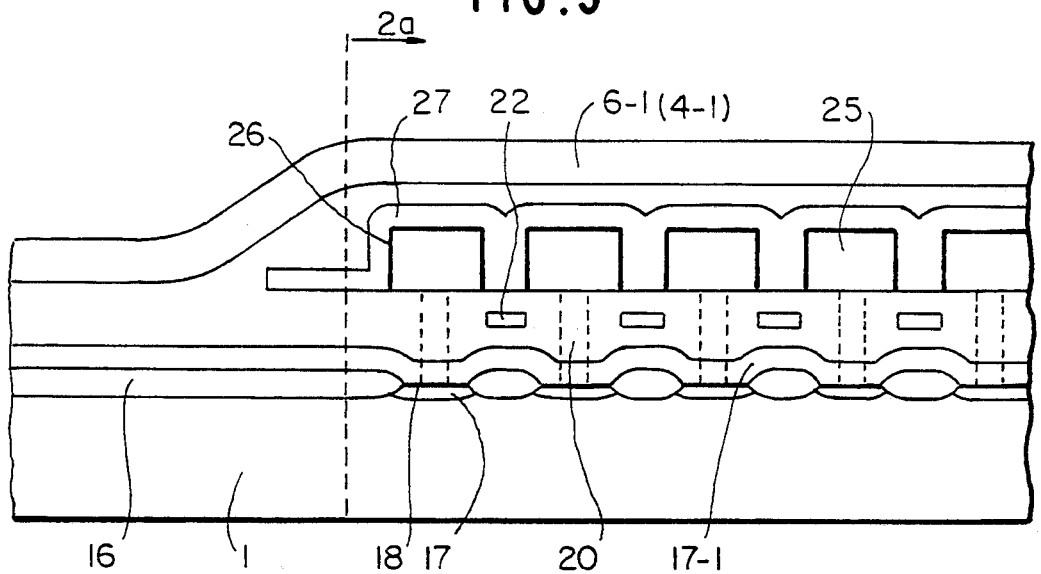
FIG. 3 is a sectional view along the line A—A in FIG. 2.
Figure 4:
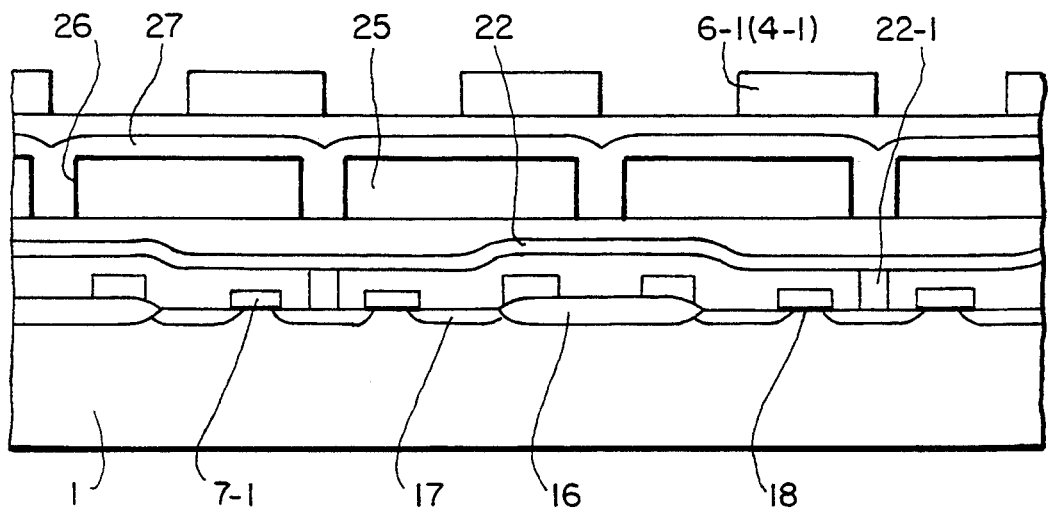
FIG. 4 is a sectional view along the line B—B in FIG. 2.

Referring to FIG. 2 and FIG. 3, the effect of this embodiment will further be described in detail. As described in the above, the height of the metallic wirings 6-1, 6-2, . . . , is different for the memory cell array region 2a and for other parts, creating a level difference. In the prior art there was a problem that disconnection is generated by the step part because of the narrow width of the metallic wirings being the same as the width of the word lines, and a problem that a satisfactory resolution was difficult to be obtained due to the difference in the focusing when the height difference of the metallic wiring pattern becomes too large. In this embodiment, however, the width of the metallic wirings in the vicinity of the step part has a greater (about twice as large) width than the ordinary wirings as is clear from FIG. 2. Accordingly, the disconnection at the step part can be prevented, and the pattern formation becomes possible even if focusing is made on the region where a fine pattern exists (the region that connects the row decoder to the memory cell array region) in the step part since the focal depth for resolution of the wiring pattern can be increased due to the widening of the wirings.

Therefore, according to the embodiment formation of the metallic wirings becomes possible even for the regions that connect the row decoders to the memory cell array region, for which the formation of the metallic wirings was not possible in the prior art, and as a result, it become possible to reduce the resistance of the word lines.

Next, referring to FIG. 5 to FIG. 8, a manufacturing method for the aforementioned semiconductor memory device will be described.

Figure 5:
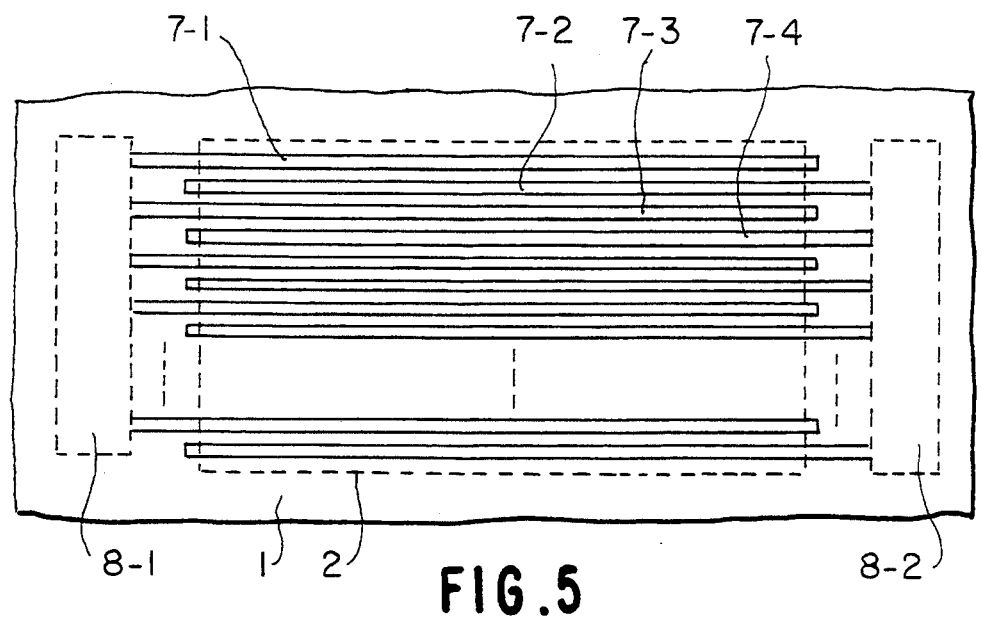
FIG. 5 and FIG. 6 are plan views for describing the manufacturing process of the invention.

As shown in FIG. 5, first, an field isolation oxide film is formed on a P-type silicon substrate 1 according to the ordinary method, and a memory cell array region 2 and a first row decoder forming region 8-1 and a second row decoder forming region 8-2, on the respective sides of the memory cell array region 2X, are distincted by the field isolation oxide film. Next, after forming a polysilicon film on a gate oxide film on the memory cell array forming region 2, word lines 7-1, 7-2, ..., consisting of polysilicon and having predetermined width and pitch by a known exposure technology. Ordinarily, what are directly connected to the row decoders are the metallic wirings on the upper layer, and it is not absolutely necessary for the word lines to reach the decoder forming region since the metallic wirings are connected electrically to the word lines through the contact parts at midway points. However, in this embodiment, an example is shown in which word lines 7-1, 7-3, ..., are formed extended reaching the first row decoder forming region 8-1 while word lines 7-2, 7-4, ..., are formed extended reaching the second row decoder forming region 8-2.

Following that, an N-type diffused region 17 (the source and drain region), bit lines 22, capacitive storage electrodes 25, interlayer insulating films 26 plate electrodes 27, (see FIG. 3 and FIG. 4) for forming the memory cells are formed sequentially according to the known technology.

Figure 6:
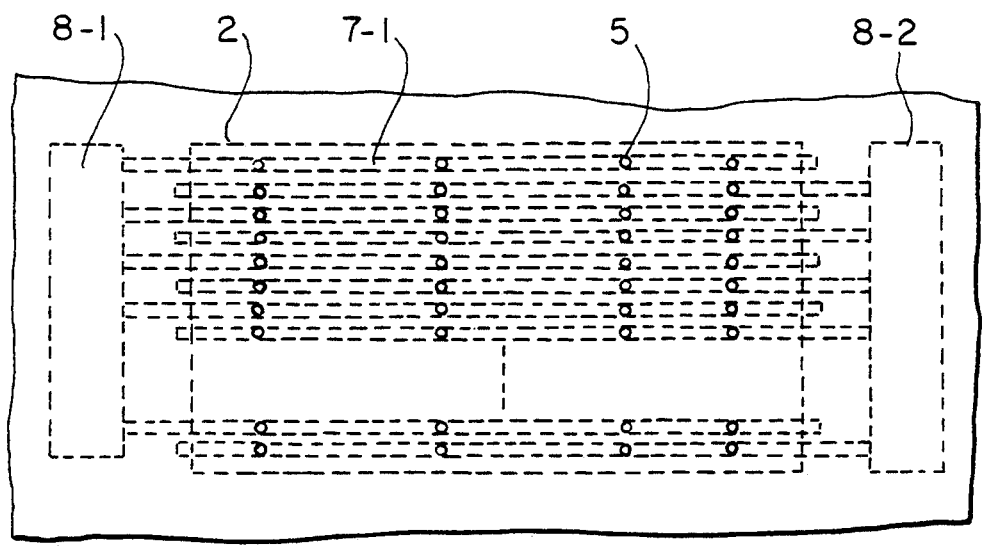
Figure 7:
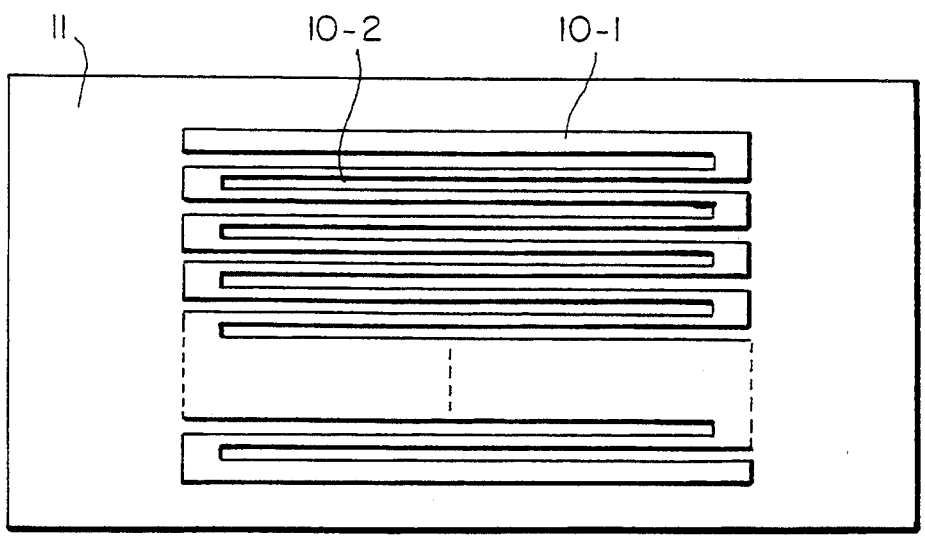
FIG. 7 and FIG. 8 are diagrams showing the mask patterns for describing the manufacturing process of the invention.
Figure 8:
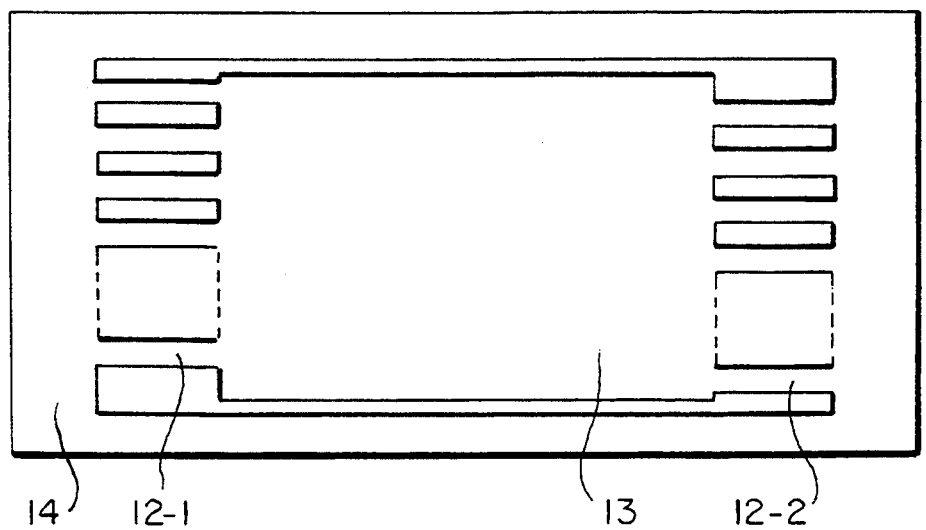

Next, as shown in FIG. 6, contact holes 5 are formed in the respective interlayer insulating films on the word lines 7-1, 7-2 . . . .

Next, after depositing an aluminum alloy film a first run of exposure process is carried out. Namely, a first run of exposure is carried out by the use of a first mask (see FIG. 7) having the parts 10-1, 10-2, ..., corresponding to word lines, and a first light shielding part 11 which covers other regions, and setting the focus on a photoresist film over the memory cell array region 2 in order to form metallic wirings 4-1, 4-2, ..., (see FIG. 1) with narrow (for example, 0.4 μm for a 64M DRAM) width to be formed at the central part of the memory cell array region.

Following the above a second run of exposure process is carried out. Namely, in order to form metallic wirings 6-1, 6-2, ... (see FIG. 1) with larger width (for example, 0.8 μm for a 64M DRAM) which connect the memory cell array region 2 and the row decoders 3-1 and 3-2, a second exposure is carried out by using a second mask (see FIG. 8) which consists of the wide width parts 12-1, 12-2, ..., of the large pitched word lines and a second light shielding part 13 that covers the part corresponding to the word lines and the part 14 corresponding to the peripheral regions where a metallic wiring pattern for the area other than the word lines exists, by setting the focus on the photoresist film that exists over the area other than the memory cell array region 2a.

Next, a metallic wiring pattern is formed by carrying out ordinary development, and the metallic wirings 4-1, 4-2, ..., and 6-1, 6-2, ..., shown in FIG. 1 are formed by etching.

Thereafter, other metallic wirings, interlayer insulating films, and the like are provided as required, completing the semiconductor memory device.

When a large level difference exists, the wiring which was not feasible by the prior art because of the difference in the focal distance of the wiring pattern across the large level difference, becomes readily realizable according to this embodiment. Moreover, the aforementioned wirings having an effect structure can be manufactured with a minimum of increase in the number of required processes, by giving just two times of exposure process and limiting the number of etching and other process to one, being the same as in the conventional method. Therefore, this embodiment has an effect of reducing the number of manufacturing processes of the semiconductor memory device.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments so fall within the true scope of the invention.

I claim:

1. A semiconductor memory device comprising:
a memory cell array region including memory cells arranged in an array form;
a plurality of word lines arranged within said memory cell array region in parallel to one another;
first and second row decoders arranged respectively on both sides of said memory cell array region;
an insulating film covering said word lines; and
a plurality of metallic wirings formed on said insulating film and electrically connected to said word lines by means of contact parts, said metallic wirings having step portions in an area where said metallic wirings pass from one layer to another layer, each of alternate ones of said metallic wirings having an elongated end portion to be connected to said first row decoder and each of remaining ones of said metallic wirings having an elongated end portion to be connected to said second row decoder, said elongated end portions of said metallic wirings having a width greater than remaining portions of said metallic wirings, said greater width being provided substantially at said step portions.

2. The semiconductor memory device as claimed in claim 1, wherein each of said memory cells comprises one insulated gate field effect transistor and one storage capacitor, a part of said word line serving as a gate electrode of said insulated gate field effect transistor, and said storage capacitor being stacked on said insulated gate field effect transistor.

3. The semiconductor memory device as claimed in claim 1, wherein the width of the end portion of each of said metallic wirings is about twice as large as the width of said word line.

4. The semiconductor memory device as claimed in claim 1, wherein said word line comprises polysilicon and said metallic wiring comprises an aluminum alloy.

* * * * *